(12) United States Patent
Otsubo et al.

(10) Patent No.: US 12,424,528 B2
(45) Date of Patent: *Sep. 23, 2025

(54) MODULE

(71) Applicant: Murata Manufacturing Co., Ltd., Nagaokakyo (JP)

(72) Inventors: Yoshihito Otsubo, Nagaokakyo (JP); Takahiro Kitazume, Nagaokakyo (JP)

(73) Assignee: MURATA MANUFACTURING CO., LTD., Kyoto-Fu (JP)

( * ) Notice: Subject to any disclaimer, the term of this patent is extended or adjusted under 35 U.S.C. 154(b) by 621 days.

This patent is subject to a terminal disclaimer.

(21) Appl. No.: 17/654,829

(22) Filed: Mar. 15, 2022

(65) Prior Publication Data

US 2022/0199504 A1 Jun. 23, 2022

Related U.S. Application Data

(63) Continuation of application No. PCT/JP2020/034948, filed on Sep. 15, 2020.

(30) Foreign Application Priority Data

Sep. 19, 2019 (JP) .................. 2019-170733

(51) Int. Cl.
*H01L 23/498* (2006.01)
*H01L 23/552* (2006.01)
*H01L 25/16* (2023.01)

(52) U.S. Cl.
CPC .. *H01L 23/49811* (2013.01); *H01L 23/49838* (2013.01); *H01L 23/552* (2013.01); *H01L 25/16* (2013.01)

(58) Field of Classification Search
CPC ......... H01L 23/49811; H01L 23/49838; H01L 23/5383; H01L 23/28; H01L 23/3107;
(Continued)

(56) References Cited

U.S. PATENT DOCUMENTS 7,649,252 B2 * 1/2010 Sakai .................. H01L 25/165
257/703
9,293,446 B2 3/2016 Matsumoto et al.
(Continued)

FOREIGN PATENT DOCUMENTS

CN 107424981 A 12/2017
JP H04-058596 A 2/1992
(Continued)

OTHER PUBLICATIONS

International Search Report for International Patent Application No. PCT/JP2020/034948 dated Dec. 8, 2020.
(Continued)

*Primary Examiner* — Bac H Au
(74) *Attorney, Agent, or Firm* — McDonald Hopkins LLC

(57) ABSTRACT

A module comprises: a substrate having a first surface; a first component that is mounted on the first surface; a first sealing resin that covers the first surface and at least a portion of the first component that is connected to the first surface; a first conductor pattern that is disposed on a surface of the first sealing resin that is farther from the first surface; and a wire that serves as a plurality of connecting conductors each electrically interconnecting the first surface and the first conductor pattern, wherein when viewed in a direction perpendicular to the first surface, the plurality of connecting conductors are disposed so as to surround the first component, and the first conductor pattern includes a frame-shaped portion that electrically interconnects the plurality of connecting conductors outside the first component successively.

4 Claims, 9 Drawing Sheets

(58) Field of Classification Search
CPC ..... H01L 2924/181; H01L 2924/18161; H01L 2924/19105; H01L 23/552; H01L 25/16; H01L 25/0652
See application file for complete search history.

(56) References Cited

U.S. PATENT DOCUMENTS

| | | | |
|---|---|---|---|
| 10,999,957 B2 | 5/2021 | Lee et al. | |
| 12,205,862 B2 | 1/2025 | Otsubo et al. | |
| 2003/0071350 A1* | 4/2003 | Takehara | H01L 23/3121 257/E23.125 |
| 2010/0244059 A1 | 9/2010 | Iida et al. | |
| 2012/0320536 A1* | 12/2012 | Yamamoto | H01L 21/561 361/728 |
| 2015/0131231 A1 | 5/2015 | Yoo et al. | |
| 2015/0279820 A1* | 10/2015 | Usami | H01L 24/97 257/737 |
| 2016/0035678 A1 | 2/2016 | Yoo et al. | |
| 2017/0033039 A1* | 2/2017 | Lee | H01L 25/0655 |
| 2017/0295643 A1 | 10/2017 | Suzuki et al. | |
| 2017/0309606 A1* | 10/2017 | Lee | H01L 23/49827 |
| 2018/0033770 A1* | 2/2018 | Hsu | H01L 25/50 |
| 2018/0092257 A1 | 3/2018 | Otsubo et al. | |
| 2018/0138155 A1* | 5/2018 | Kim | H01L 25/0657 |
| 2018/0323170 A1* | 11/2018 | Kim | H01L 21/4853 |
| 2019/0028083 A1* | 1/2019 | Yasuda | H03H 9/0552 |
| 2019/0067207 A1* | 2/2019 | Hu | H01L 21/4871 |
| 2019/0074267 A1* | 3/2019 | Yang | H01L 25/16 |
| 2019/0189565 A1* | 6/2019 | Chen | H01L 21/565 |
| 2019/0273312 A1* | 9/2019 | Otsubo | H05K 9/00 |
| 2019/0289758 A1* | 9/2019 | Furuya | H05K 5/065 |
| 2019/0326256 A1* | 10/2019 | Chang | H01L 25/04 |
| 2019/0364660 A1* | 11/2019 | Sato | H01L 21/56 |
| 2019/0393166 A1 | 12/2019 | Otsubo | |
| 2020/0013738 A1* | 1/2020 | Yang | H01L 24/45 |
| 2020/0135654 A1* | 4/2020 | Lee | H01L 23/3135 |
| 2020/0343151 A1* | 10/2020 | Nomura | H01L 21/56 |
| 2021/0351093 A1* | 11/2021 | Takakura | H01L 25/071 |
| 2022/0199485 A1* | 6/2022 | Otsubo | H05K 1/02 |
| 2022/0199540 A1 | 6/2022 | Singh et al. | |
| 2022/0418089 A1 | 12/2022 | Nomura et al. | |

FOREIGN PATENT DOCUMENTS

| | | |
|---|---|---|
| JP | 2010-027996 A | 2/2010 |
| JP | 5273154 B2 | 8/2013 |
| JP | 5552821 B2 | 7/2014 |
| JP | 2017-191835 A | 10/2017 |
| JP | 2018-041899 A | 3/2018 |
| JP | 2018-088460 A | 6/2018 |
| WO | 2016/181954 A1 | 11/2016 |
| WO | 2018/101384 A1 | 6/2018 |
| WO | 2018/110397 A1 | 6/2018 |
| WO | 2018/164158 A1 | 9/2018 |
| WO | 2019/138895 A1 | 7/2019 |

OTHER PUBLICATIONS

Written Opinion for International Patent Application No. PCT/JP2020/034948 dated Dec. 8, 2020.

\* cited by examiner

MODULE

CROSS REFERENCE TO RELATED APPLICATION

This is a continuation of International Application No. PCT/JP2020/034948 filed on Sep. 15, 2020 which claims priority from Japanese Patent Application No. 2019-170733 filed on Sep. 19, 2019. The contents of these applications are incorporated herein by reference in their entireties.

BACKGROUND OF THE DISCLOSURE

Field of the Disclosure

The present disclosure relates to a module.

Description of the Related Art

U.S. Patent Application Publication No. US2018/0323170A1 (PTL 1) discloses a semiconductor package comprising a compartment shield structure (see PTL 1, FIG. 9A and paragraph 0098). In this semiconductor package, electronic components are mounted on opposite surfaces of a substrate, and these electronic components are sealed on upper and lower sides of the substrate by a sealing material. A shield film convers upper and side surfaces of the sealing material located on the upper side of the substrate. The compartment shield structure is implemented so as to surround the electronic component mounted on the lower surface of the substrate, and a portion thereof forming a lower surface is exposed at a lower surface of the sealing material. While a portion of the lower surface of the sealing material on the lower side of the substrate is covered with the shield film, the remaining portion thereof is exposed without being covered with the shield film. An external connection terminal is provided at a peripheral edge of the lower surface of the substrate. At the location where the external connection terminal is disposed, a through hole is provided through the sealing material located on the lower side of the substrate, and the external connection terminal is disposed so as to project downward from the sealing material.

(PTL 1) U.S. Patent Application Publication No. US2018/0323170A1

BRIEF SUMMARY OF THE DISCLOSURE

While According to PTL 1 the compartment shield is implemented by disposing on the lower surface of the sealing material a conductive film having a size larger than that of the component mounted on the lower surface of the substrate, a conductive film having a further larger area will be required when a larger number of components are mounded or the component is increased in size.

When a conductive film having a large area is disposed on the lower surface of the sealing material in order to implement the compartment shield, the conductive film is more likely to peel off the sealing material as they have different coefficients of thermal expansion.

Accordingly, an object of the present disclosure is to provide a module that implements a compartment shield for a component mounted on a lower surface of a substrate while suppressing a possibility of peeling.

In order to achieve the above object, a module according to the present disclosure comprises: a substrate having a first surface; a first component that is mounted on the first surface; a first sealing resin that covers the first surface and at least a portion of the first component that is connected to the first surface; a first conductor pattern disposed on a surface of the first sealing resin that is farther from the first surface; and a wire that serves as a plurality of connecting conductors each electrically interconnecting the first surface and the first conductor pattern. When viewed in a direction perpendicular to the first surface, the plurality of connecting conductors are disposed so as to surround the first component, and the first conductor pattern includes a frame-shaped portion that electrically interconnects the plurality of connecting conductors outside the first component successively.

According to the present disclosure, a compartment shield is formed by surrounding a first component by a plurality of connecting conductors and a first conductor pattern. And rather than disposing a conductor pattern of a large area on a surface of a first sealing resin farther from a first surface, a frame-shaped portion of the first conductor pattern is disposed on the surface of the first sealing resin farther from the first surface, and a problem of peeling due to a difference between coefficients of thermal expansion is thus less likely to occur, and as a result, a module that implements a compartment shield for a component mounted on a lower surface of a substrate while suppressing a possibility of peeling can be implemented.

DETAILED DESCRIPTION OF THE DISCLOSURE

The figures indicate a dimensional ratio, which does not necessarily provide a representation which is faithful to reality, and may be exaggerated for the sake of illustration. In the following description, when referring to a concept of being upper or lower, it does not necessarily mean being absolutely upper or lower and may instead mean being relatively upper or lower in a position shown in a figure.

First Embodiment

Figure 1:
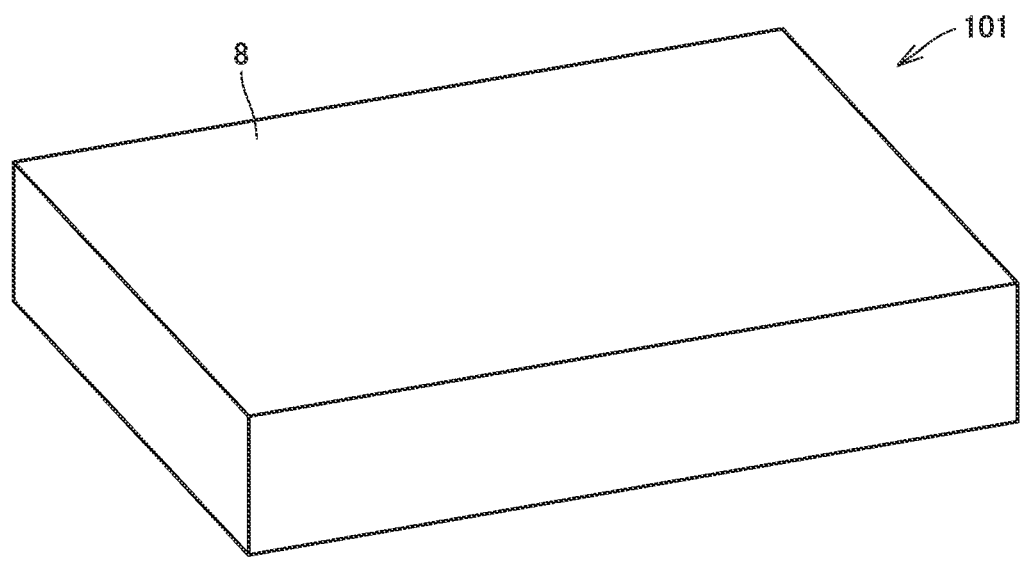
FIG. 1 is a perspective view of a module according to a first embodiment of the present disclosure.
Figure 2:
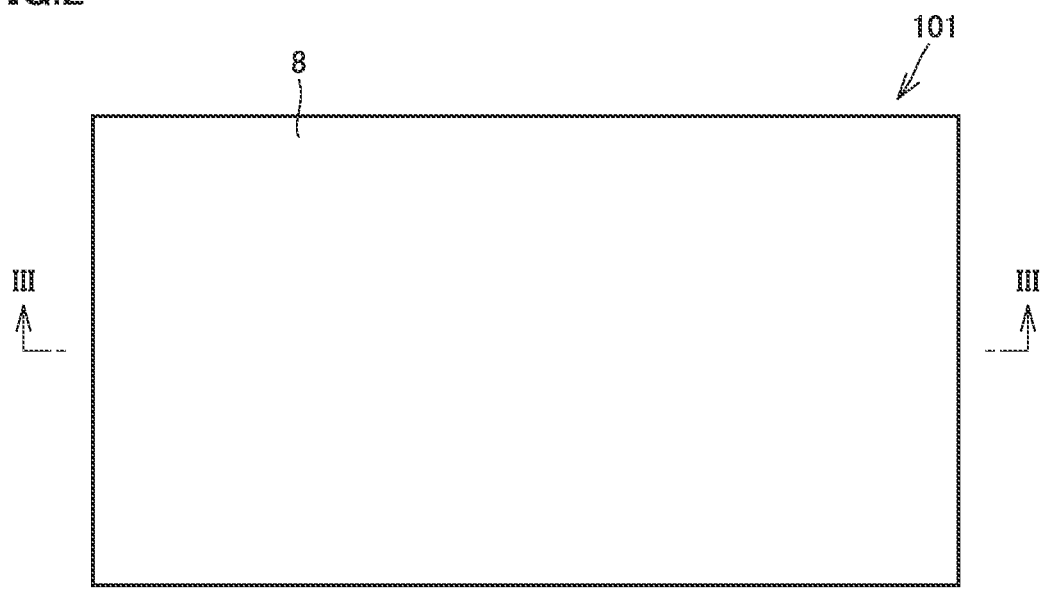
FIG. 2 is a plan view of the module according to the first embodiment of the present disclosure.
Figure 3:
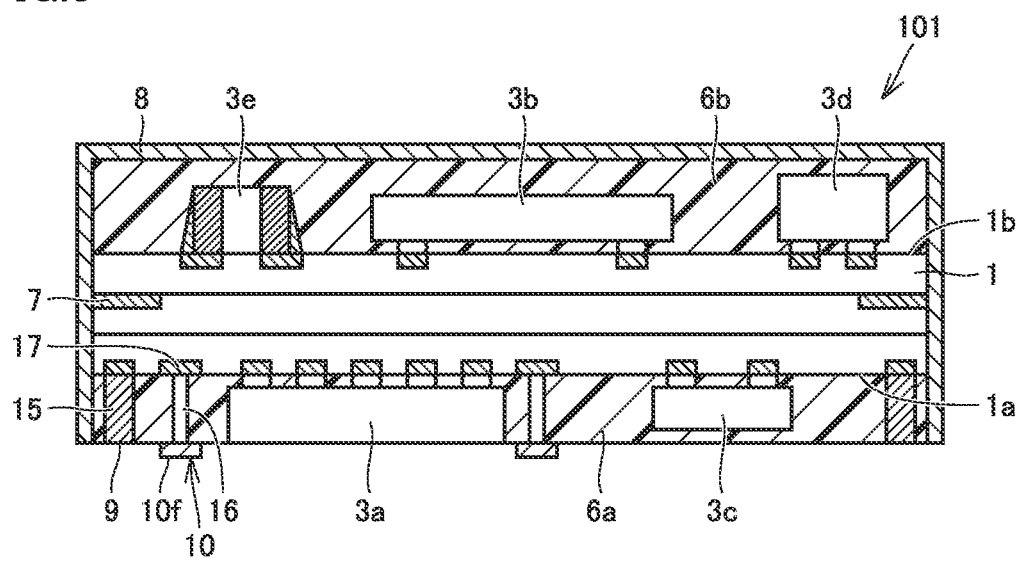
FIG. 3 is a cross section taken along a line III-III indicated in FIG. 2.
Figure 4:
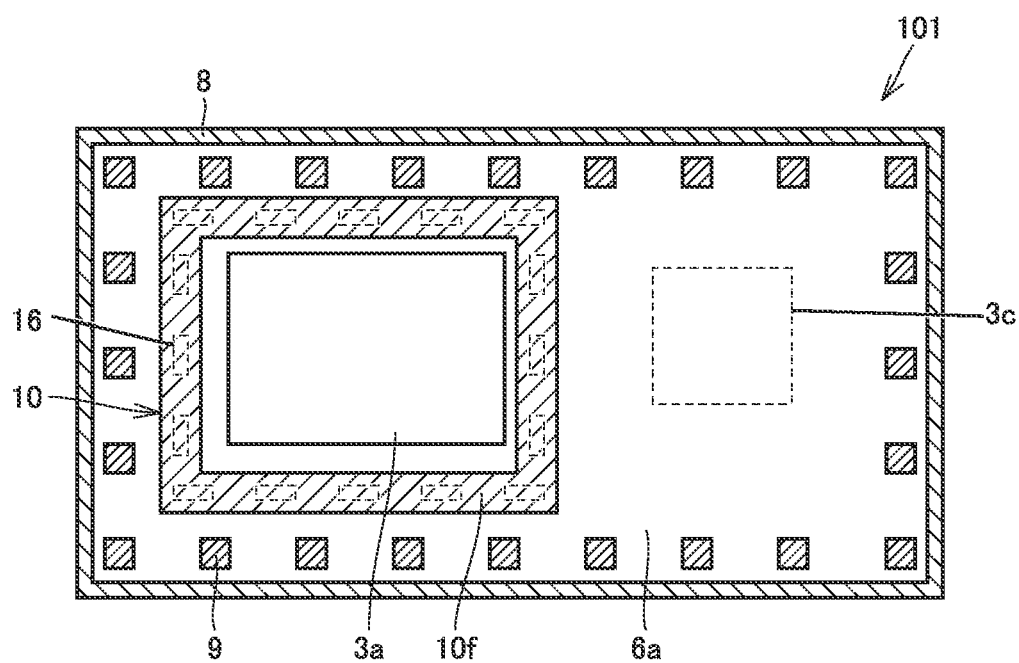
FIG. 4 is a bottom view of the module according to the first embodiment of the present disclosure.

A module according to a first embodiment of the present disclosure will now be described with reference to FIGS. 1 to 5. FIG. 1 is a perspective view of a module 101 according to the present embodiment. FIG. 2 is a plan view of module 101. FIG. 3 is a cross section taken along a line III-III indicated in FIG. 2. FIG. 4 is a bottom view of module 101. Note that, for the sake of illustration, FIG. 3 also shows components having a positional relationship which should not allow the components to appear together in the same cross section. This also applies to other cross sections described below.

Module 101 comprises: a substrate 1 having a first surface 1a; a first component 3a that is mounted on first surface 1a; a first sealing resin 6a that covers first surface 1a and at least a portion of first component 3a that is connected to first surface 1a; a first conductor pattern 10 that is disposed on a surface of first sealing resin 6a that is farther from first surface 1a; and a wire 16 that serves as a plurality of connecting conductors each electrically interconnecting first surface 1a and first conductor pattern 10. When viewed in a direction perpendicular to first surface 1a, the plurality of connecting conductors are disposed so as to surround first component 3a, and first conductor pattern 10 includes a frame-shaped portion 10f that electrically interconnects the plurality of connecting conductors outside first component 3a successively.

Substrate 1 has a second surface 1b on a side opposite to first surface 1a. Module 101 comprises a second component 3b mounted on second surface 1b, and a second sealing resin 6b that covers second surface 1b and second component 3b.

In the example indicated herein, in addition to second component 3b, a component 3d and a component 3e are mounted on second surface 1b of substrate 1. Second sealing resin 6b is formed so as to cover all of the components mounted on second surface 1b. On first surface 1a of substrate 1, a component 3c is mounted in addition to first component 3a. First sealing resin 6a is formed so as to cover component 3c. A surface of a portion of first component 3a is exposed from first sealing resin 6a.

Substrate 1 is a wiring substrate. Substrate 1 is, for example, a ceramic multilayer substrate. Substrate 1 may be a resin substrate. The resin substrate as referred to herein may for example be a resin multilayer substrate. Wiring may be provided on and in substrate 1.

As shown in FIG. 3, a shield film 8 is formed so as to cover upper and side surfaces of second sealing resin 6b, a side surface of substrate 1, and a side surface of first sealing resin 6a. Shield film 8 is a conductive film. Shield film 8 is, for example, a metal film. Shield film 8 may be formed by sputtering, for example. As shown in FIG. 3, shield film 8 is electrically connected to conductor pattern 7 disposed in substrate 1. Conductor pattern 7 is a ground electrode. Conductor pattern 7 is exposed on a side surface of substrate 1.

Figure 5:
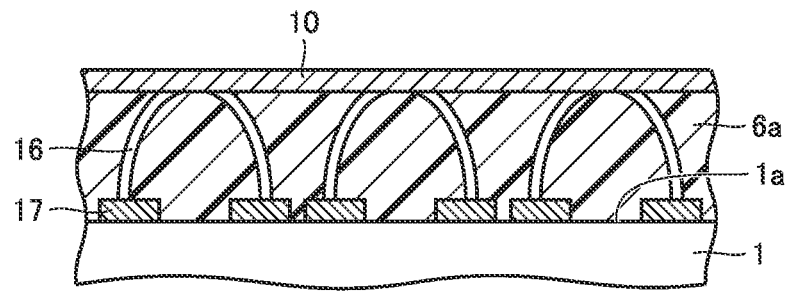
FIG. 5 is a cross section of a portion of the module at which a plurality of connecting conductors electrically interconnect a first surface and a first conductor pattern according to the first embodiment of the present disclosure.

FIG. 5 shows a structure of a portion in which wire 16 as a plurality of connecting conductors electrically interconnects first surface 1a and first conductor pattern 10. A pad electrode 17 is formed on first surface 1a, and wire 16 has ends each connected to pad electrode 17.

As shown in FIG. 3, a columnar conductor 15 is disposed on a peripheral edge portion of first surface 1a of substrate 1. Columnar conductor 15 penetrates through first sealing resin 6a. An end face of columnar conductor 15 located on a side further from first surface 1a is exposed from first sealing resin 6a and serves as an external connection terminal 9. As shown in FIG. 4, at the lower surface of module 101, external connection terminal 9 is arranged along the peripheral edge portion. While a plurality of external connection terminals 9 are mainly terminals provided for a signal line, some of the plurality of external connection terminals 9 may be a ground terminal.

In the present embodiment, a compartment shield can be implemented since first component 3a is surrounded by the plurality of connecting conductors and first conductor pattern 10. In particular, rather than disposing a conductor pattern of a large area on a surface of first sealing resin 6a farther from first surface 1a, frame-shaped portion 10f of first conductor pattern 10 is disposed on the surface of first sealing resin 6a farther from first surface 1a, and a problem of peeling due to a difference between the coefficient of thermal expansion of the conductive film and that of the sealing material is also less likely to occur. Therefore, in the present embodiment, a compartment shield for a component mounted on a lower surface of a substrate can be implemented while suppressing a possibility of peeling.

As indicated in the present embodiment, it is preferable that the surface of first component 3a farther from first surface 1a be exposed from first sealing resin 6a. By adopting this configuration, heat radiation from first component 3a can be promoted. Further, first sealing resin 6a does not need to cover first component 3a, and first sealing resin 6a can be reduced in thickness on the side of first surface 1a, thereby contributing to reduction in height of the entire module.

As indicated in the present embodiment, it is preferable to comprise shield film 8 disposed so as to cover a surface of second sealing resin 6b farther from second surface 1b and a side surface of second sealing resin 6b, a side surface of substrate 1, and a side surface of first sealing resin 6a. By adopting this configuration, an external electromagnetic wave can be shielded.

Figure 6:
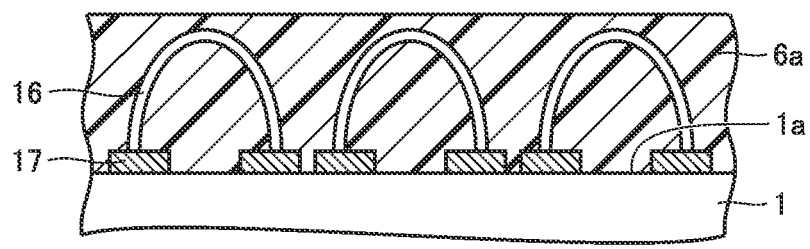
FIG. 6 is a first diagram for illustrating a method for obtaining the structure shown in FIG. 5.
Figure 7:
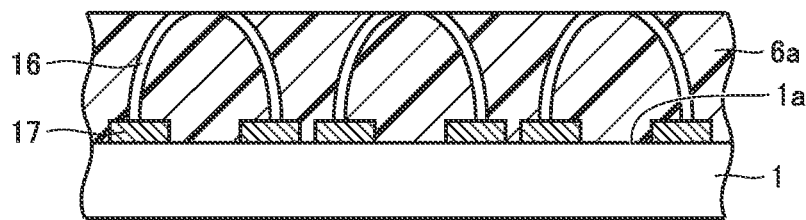
FIG. 7 is a second diagram for illustrating the method for obtaining the structure shown in FIG. 5.

The structure shown in FIG. 5 may be such that, as shown in FIG. 6, wire 16 is disposed in the form of an arch interconnecting two pad electrodes 17, and sealed with first sealing resin 6a, and thereafter, as shown in FIG. 7, first sealing resin 6a has a surface polished to thereby remove an apex of the arch of wire 16. In this way, wire 16 forming a single arch will be right and left, separated wires 16. Thereafter forming first conductor pattern 10 allows the FIG. 5 structure to be formed. As shown in FIG. 5, it is preferable that the connecting conductor be wire 16 that has opposite ends each connected to first surface 1a and is also disposed so as to rise from first surface 1a in the form of an arch, and has removed a portion thereof located farther from first surface 1a. As a portion of wire 16 is polished or the like and thus removed, a flat surface of wire 16 is formed, and a large contact area between first conductor pattern 10 and wire 16 can be ensured.

Second Embodiment

Figure 8:
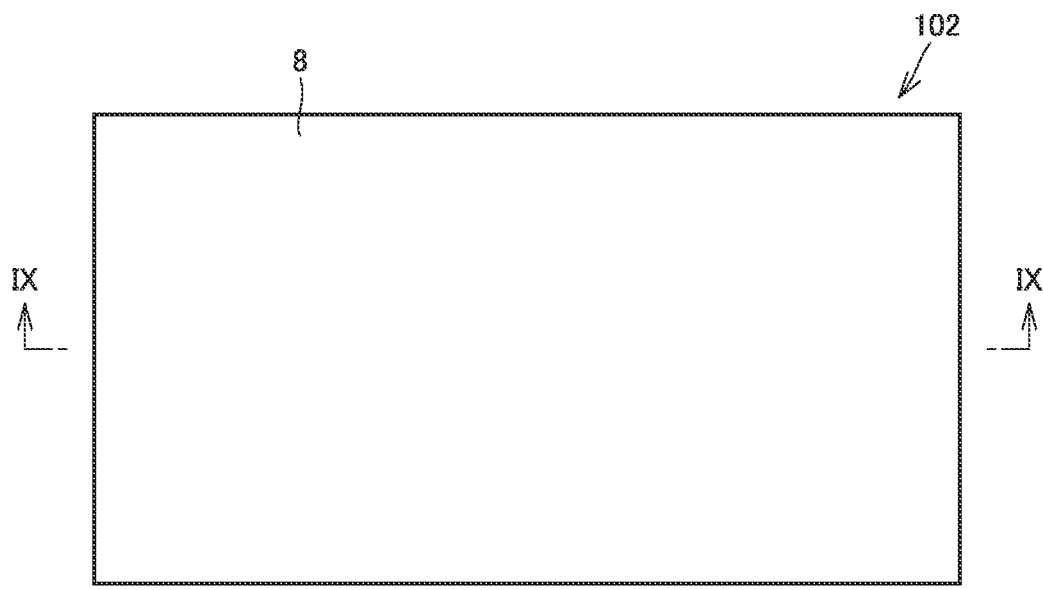
FIG. 8 is a plan view of a module according to a second embodiment of the present disclosure.
Figure 9:
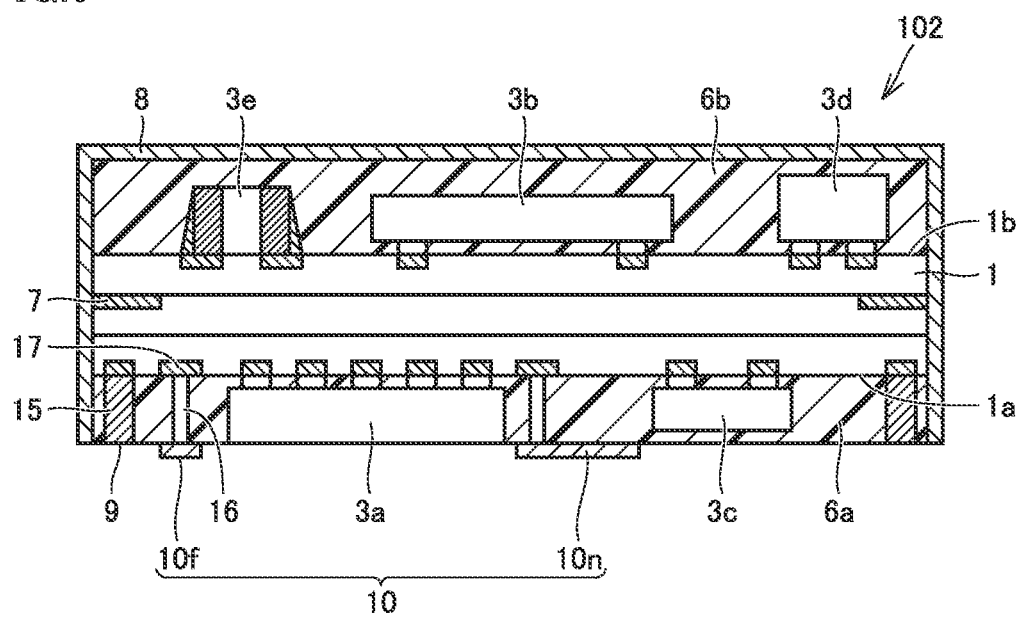
FIG. 9 is a cross section taken along a line IX-IX indicated in FIG. 8.
Figure 10:
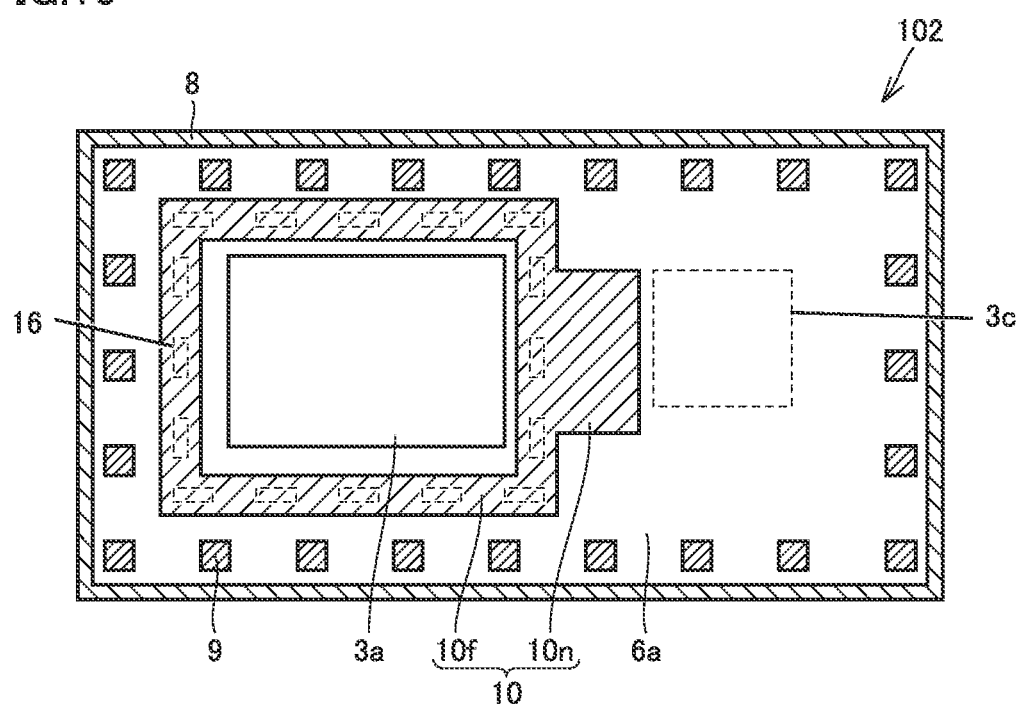
FIG. 10 is a bottom view of the module according to the second embodiment of the present disclosure.

A module according to a second embodiment of the present disclosure will now be described with reference to FIGS. 8 to 10. FIG. 8 is a plan view of a module 102 in the present embodiment. FIG. 9 is a cross section taken along a line IX-IX indicated in FIG. 8. FIG. 10 is a bottom view of module 102. While module 102 has a basic configuration similar to that of module 101 described in the first embodiment, the former has the following configuration.

In module 102, first conductor pattern 10 includes a land-shaped portion 10n that projects from frame-shaped portion 10f in a direction parallel to first surface 1a.

As has been indicated in the present embodiment, as first conductor pattern 10 includes land-shaped portion 10n, module 102 can be grounded using land-shaped portion 10n. It is also preferable to expose at least a portion of land-shaped portion 10n from a resist film (not shown) when the resist film covers a major portion of the lower surface of the module. When the module is to be mounted on a mother board, and frame-shaped portion 10f is too narrow to be electrically connected, land-shaped portion 10n that ensures a large area can be used to facilitate electrical connection to first conductor pattern 10. Electrical connection as referred to herein is, for example, connection to a ground terminal prepared on the side of the mother board.

Third Embodiment

Figure 11:
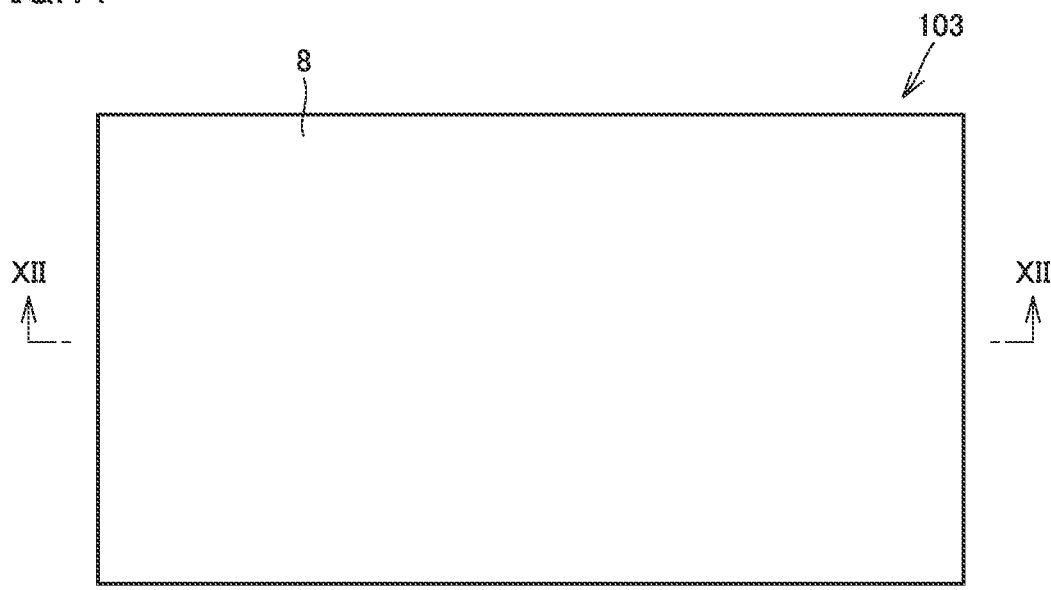
FIG. 11 is a plan view of a module according to a third embodiment of the present disclosure.
Figure 12:
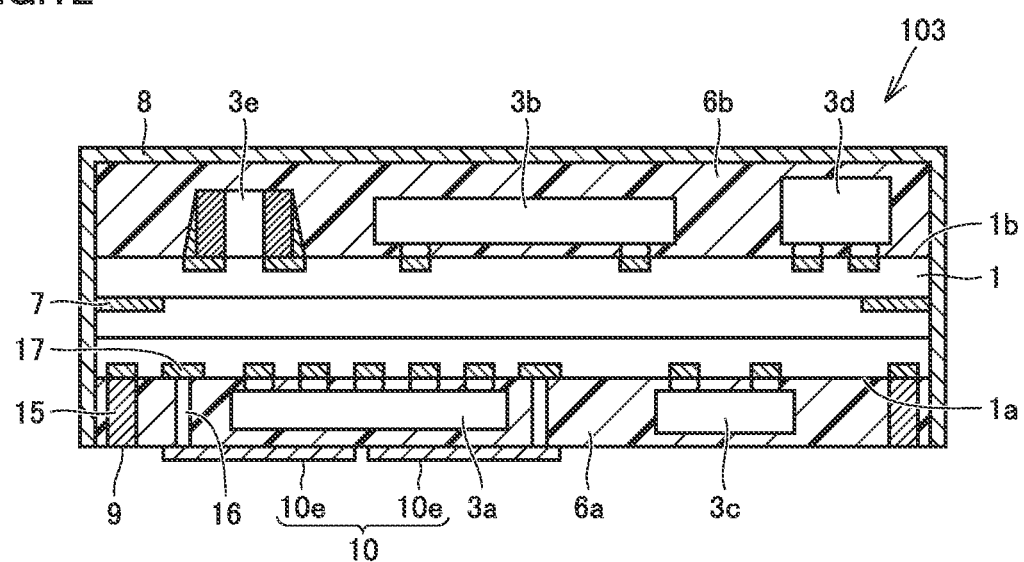
FIG. 12 is a cross section taken along a line XII-XII indicated in FIG. 11.
Figure 13:
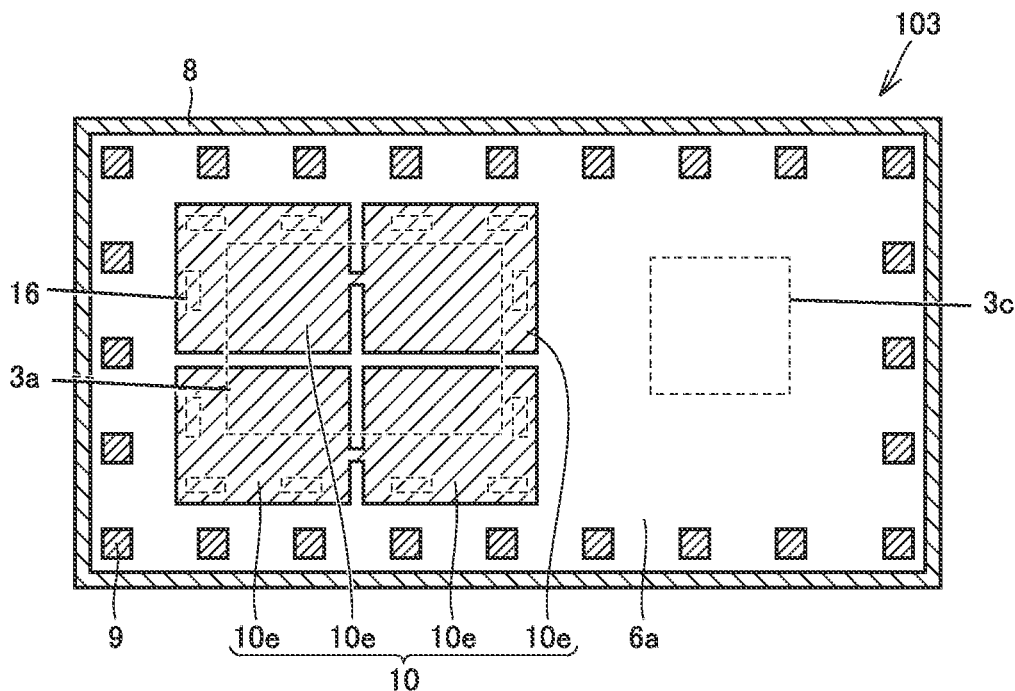
FIG. 13 is a bottom view of the module according to the third embodiment of the present disclosure.

A module according to a third embodiment of the present disclosure will now be described with reference to FIGS. 11 to 13. FIG. 11 is a plan view of a module 103 according to the present embodiment. FIG. 12 is a cross section taken along a line XII-XII indicated in FIG. 11. FIG. 13 is a bottom view of module 103. While module 103 has a basic configuration similar to that of module 101 described in the first embodiment, the former has the following configuration.

Module 103 comprises: a substrate 1 having a first surface 1a; a first component 3a that is mounted on first surface 1a; a first sealing resin 6a that covers first surface 1a and first component 3a; a first conductor pattern 10 that is disposed on a surface of first sealing resin 6a that is farther from first surface 1a; and a wire 16 that serves as a plurality of connecting conductors each electrically interconnecting first surface 1a and first conductor pattern 10. When viewed in a direction perpendicular to first surface 1a, the plurality of connecting conductors are disposed to surround first component 3a, and first conductor pattern 10 includes a plurality of tile-shaped portions 10e disposed to cover a region overlapping first component 3a and the plurality of connecting conductors.

Substrate 1 has a second surface 1b on a side opposite to first surface 1a. Module 103 comprises a second component 3b mounted on second surface 1b, and a second sealing resin 6b that covers second surface 1b and second component 3b.

In the present embodiment, rather than disposing a conductor pattern of a large area on a surface of first sealing resin 6a farther from first surface 1a, the plurality of tile-shaped portions 10e are disposed to implement the compartment shield, and individual tile-shaped portion 10e can have a small area. Thus, a problem of peeling due to a difference between the coefficient of thermal expansion of the conductive film and that of the sealing material is less likely to occur, and in the present embodiment, the compartment shield can be implemented while suppressing a possibility of peeling.

As has been indicated in the present embodiment, it is preferable that at least some of the plurality of tile-shaped portions 10e be interconnected.

Figure 14:
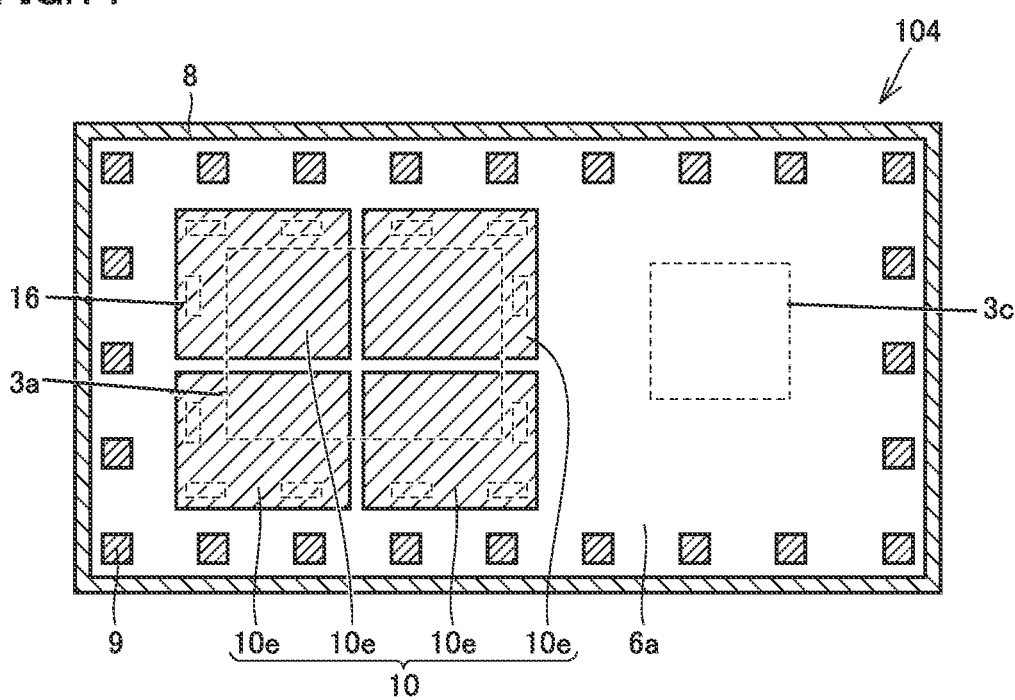
FIG. 14 is a bottom view of a first exemplary variation of the module according to the third embodiment of the present disclosure.

As in a module 104 shown in FIG. 14, the plurality of tile-shaped portions 10e may not be interconnected and may instead be disposed as separate conductor patterns. In this case as well, one or more wires 16 are electrically connected to each tile-shaped portion 10e.

Figure 15:
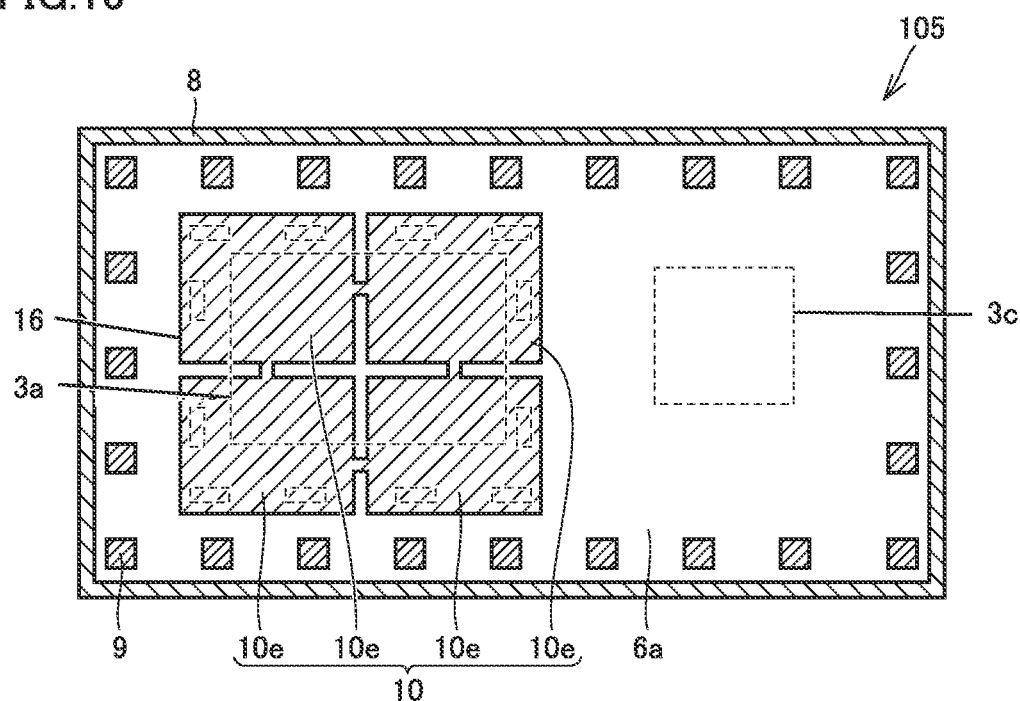
FIG. 15 is a bottom view of a second exemplary variation of the module according to the third embodiment of the present disclosure.

Although two tile-shaped portions 10e are interconnected in FIG. 13, all tile-shaped portions 10e may be interconnected as in a module 105 shown in FIG. 15. In the example shown in FIG. 15, all tile-shaped portions 10e are annularly interconnected.

Fourth Embodiment

Figure 16:
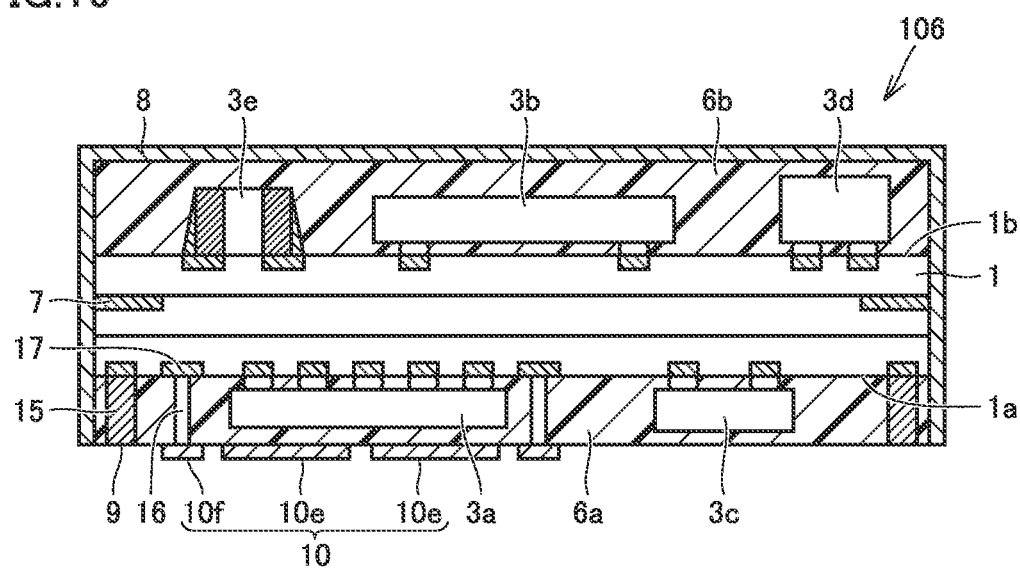
FIG. 16 is a cross section of a module according to a fourth embodiment of the present disclosure.
Figure 17:
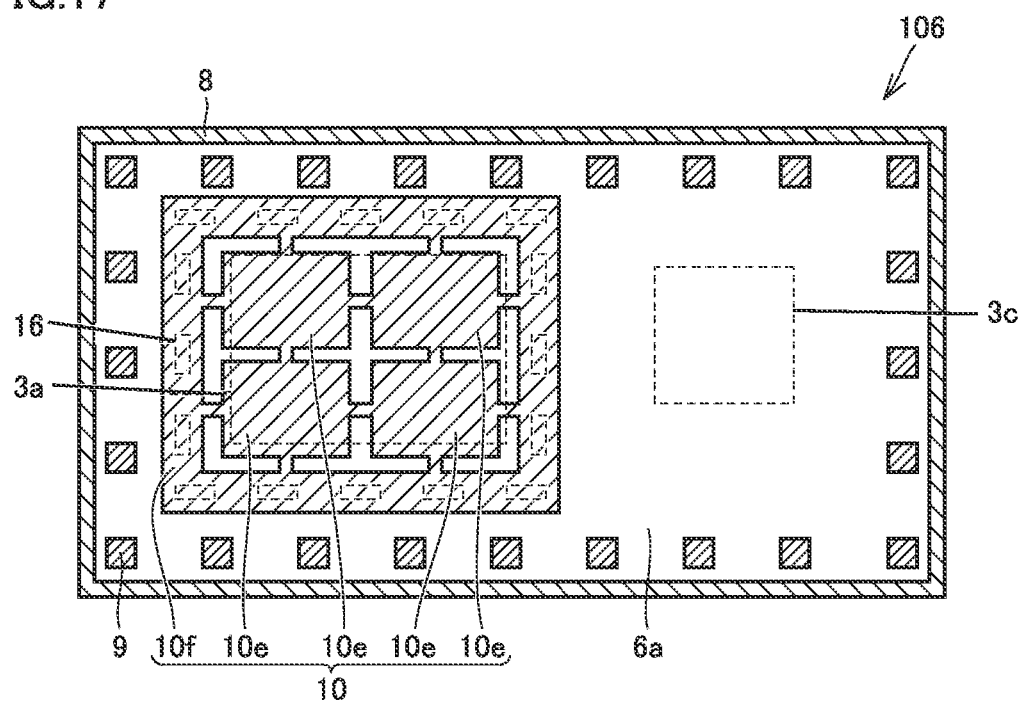
FIG. 17 is a bottom view of the module according to the fourth embodiment of the present disclosure.

A module according to a fourth embodiment of the present disclosure will now be described with reference to FIGS. 16 and 17. FIG. 16 is a cross section of a module 106 in the present embodiment. FIG. 17 is a bottom view of module 106.

While module 106 has a basic configuration similar to that of module 101 described in the first embodiment, the former has the following configuration.

In module 106, first conductor pattern 10 includes a plurality of tile-shaped portions 10e inside frame-shaped portion 10f. The plurality of tile-shaped portions 10e are connected to frame-shaped portion 10f.

The present embodiment can also achieve an effect similar to that described in the first and third embodiments.

Figure 18:
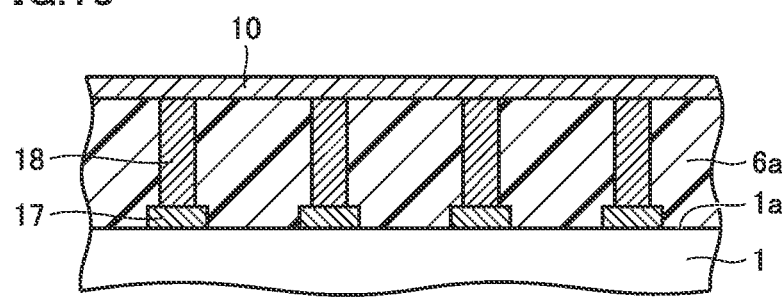
FIG. 18 is a partial cross section in a vicinity of a connecting conductor when the connecting conductor is a pin.

Each embodiment described above has been described by referring to an example in which the plurality of connecting conductors electrically interconnecting first surface 1a and first conductor pattern 10 are wire 16. The connecting conductor may be in a form other than a wire. The connecting conductor is preferably any one of a wire, a pin, a metal block, and a plating film. For example, FIG. 18 is a partial cross section in a vicinity of a connecting conductor when the connecting conductor is a pin 18. Pin 18 is made of metal. Pin 18 is disposed so as to penetrate through first sealing resin 6a. Pad electrode 17 is formed on first surface 1a of substrate 1. An end of pin 18 that is closer to substrate 1 is connected to pad electrode 17.

While each embodiment described above has been described by referring to a module having a double-sided mounting structure by way of example, the module according to the present disclosure may be a module having a single-sided mounting structure. For example, the module may have a configuration in which no second component is mounted on second surface 1b of substrate 1 and the second sealing resin is not disposed.

Note that a plurality of the above embodiments may be combined as appropriate and employed.

It should be understood that the embodiments disclosed herein are illustrative and non-restrictive in any respect. The scope of the present disclosure is defined by the terms of the claims, and is intended to include any modifications within the meaning and scope equivalent to the terms of the claims.

1 substrate, 1a first surface, 1b second surface, 3a first component, 3b second component, 3c, 3d, 3e component, 6a first sealing resin, 6b second sealing resin, 7 conductor pattern, 8 shield film, 9 external connection terminal, 10 first conductor pattern, 10f frame-shaped portion, 10e tile-shaped portion, 10n land-shaped portion, 15 columnar conductor, 16 wire, 17 pad electrode, 18 pin, 101, 102, 103, 104, 105, 106 module.

The invention claimed is:

1. A module comprising:

a substrate having a first surface;

a first component mounted on the first surface;

a first sealing resin covering the first surface and the first component;

a first conductor pattern disposed on a surface of the first sealing resin farther from the first surface; and a plurality of connecting conductors each electrically interconnecting the first surface and the first conductor pattern, wherein when viewed in a direction perpendicular to the first surface, the plurality of connecting conductors are disposed to surround the first component, and the first conductor pattern includes a plurality of tile-shaped portions disposed to cover a region overlapping the first component, and the plurality of connecting conductors, wherein the first component is a single component, and wherein each of the plurality of the tile shaped portions overlap the first component.

2. The module according to claim 1, the substrate having a second surface opposite to the first surface, the module further comprising:

a second component mounted on the second surface; and a second sealing resin covering the second surface and the second component.

3. The module according to claim 1, wherein at least some of the plurality of tile-shaped portions are interconnected.

4. The module according to claim 1, wherein the connecting conductor is any one of a wire, a pin, a metal block, and a plating film.

* * * * *

UNITED STATES PATENT AND TRADEMARK OFFICE
CERTIFICATE OF CORRECTION

PATENT NO. : 12,424,528 B2
APPLICATION NO. : 17/654829
DATED : September 23, 2025
INVENTOR(S) : Yoshihito Otsubo et al.

It is certified that error appears in the above-identified patent and that said Letters Patent is hereby corrected as shown below:

In the Specification

Column 6, Line 62, "1a first surface, 1b second" should be --1a first surface, 1b second--

Signed and Sealed this
Second Day of December, 2025

John A. Squires
*Director of the United States Patent and Trademark Office*